(12) United States Patent
Berben et al.

(10) Patent No.: US 7,982,233 B2
(45) Date of Patent: Jul. 19, 2011

(54) OPTOELECTRONIC SEMICONDUCTOR CHIP COMPRISING A WAVELENGTH CONVERSION SUBSTANCE, AND OPTOELECTRONIC SEMICONDUCTOR COMPONENT COMPRISING SUCH A SEMICONDUCTOR CHIP, AND METHOD FOR PRODUCING THE OPTOELECTRONIC SEMICONDUCTOR CHIP

(75) Inventors: Dirk Berben, Taufkirchen (DE); Frank Jermann, Koenigsbrunn (DE)

(73) Assignee: Osram Opto Semiconductors GmbH, Regensberg (DE)

( * ) Notice: Subject to any disclaimer, the term of this patent is extended or adjusted under 35 U.S.C. 154(b) by 134 days.

(21) Appl. No.: 12/301,538

(22) PCT Filed: May 18, 2007

(86) PCT No.: PCT/DE2007/000898
§ 371 (c)(1),
(2), (4) Date: Mar. 12, 2009

(87) PCT Pub. No.: WO2007/134582
PCT Pub. Date: Nov. 29, 2007

(65) Prior Publication Data
US 2009/0272998 A1    Nov. 5, 2009

(30) Foreign Application Priority Data

May 23, 2006   (DE) .................... 10 2006 024 165

(51) Int. Cl.
   H01L 29/22   (2006.01)
   H01L 33/00   (2010.01)
(52) U.S. Cl. .................. 257/98; 257/E33.055
(58) Field of Classification Search ........... 257/E33.055, 257/98
See application file for complete search history.

(56) References Cited

U.S. PATENT DOCUMENTS

| | | | |
|---|---|---|---|
| 3,819,409 A * | 6/1974 | Phillips | 427/69 |
| 5,684,309 A | 11/1997 | McIntosh et al. | |
| 5,831,277 A | 11/1998 | Razeghi | |
| 5,898,185 A * | 4/1999 | Bojarczuk et al. | 257/103 |
| 6,172,382 B1 | 1/2001 | Nagahama et al. | |
| 6,849,881 B1 | 2/2005 | Harle et al. | |

(Continued)

FOREIGN PATENT DOCUMENTS

CN    1542991    11/2004
(Continued)

OTHER PUBLICATIONS

State Intellectual Property Office, P.R. China, "First Office Action", Patent Application No. 200780027608.1, issued on May 18, 2010 (4 pages).

(Continued)

Primary Examiner — Lex Malsawma
(74) Attorney, Agent, or Firm — Fish & Richardson P.C.

(57) ABSTRACT

A semiconductor chip comprises: a semiconductor body which comprises a semiconductor layer sequence suitable for emitting electromagnetic radiation of a first wavelength range from its front side; and a first wavelength-converting layer on at least one first partial region of the front side of the semiconductor body with a first wavelength conversion substance, which converts radiation of the first wavelength range into radiation of a second wavelength range, which is different from the first wavelength range, wherein at least one second partial region of the front side is free of the first wavelength-converting layer. An optoelectronic component comprising such a semiconductor chip and a method for producing the semiconductor chip are furthermore described.

23 Claims, 8 Drawing Sheets

U.S. PATENT DOCUMENTS

| | | |
|---|---|---|
| 7,045,375 B1 | 5/2006 | Wu et al. |
| 7,078,732 B1 | 7/2006 | Reeh et al. |
| 7,208,769 B2 | 4/2007 | Guenther et al. |
| 2004/0125190 A1* | 7/2004 | Koyama ........................ 347/105 |
| 2004/0217692 A1 | 11/2004 | Cho et al. |

FOREIGN PATENT DOCUMENTS

| | | |
|---|---|---|
| EP | 0 855 751 | 7/1998 |
| EP | 1 017 113 | 7/2000 |
| EP | 1 566 848 | 8/2005 |
| EP | 1 592 074 | 11/2005 |
| JP | 11-204832 | 7/1999 |
| WO | WO 97/50132 | 12/1997 |
| WO | WO 98/31055 | 7/1998 |
| WO | WO 01/39282 | 5/2001 |
| WO | WO 01/69692 | 9/2001 |
| WO | WO 2007/051499 | 5/2007 |
| WO | WO 2007/069148 | 6/2007 |

OTHER PUBLICATIONS

Schnitzer et al., "30% external quantum efficiency from surface textured, thin-film light-emitting diodes", *App. Phys. Lett.*, vol. 63:2174-2176 (1993).

English translation of the International Preliminary Report on Patentability for corresponding International Application No. PCT/DE2007/000898, Feb. 2009.

* cited by examiner

| Substance group | Wavelength conversion substance | Emission |
|---|---|---|
| Garnets | $(Y, Tb, Gd, Lu)_3(Al, Ga)_5O_{12}:Ce^{3+}$ | Yellow |
| Alkaline earth metal sulfides<br>Alkaline earth metal selenides<br>Alkaline earth metal sulfoselenides | $(Sr, Ca)(S, Se):Eu^{2+}$ | Red |
| Thiogallates<br>Thiometallates | $(Sr, Ca, Ba, Mg)(Ga, Al)_2S_4:Eu^{2+}$ | Green |
| Aluminates | $(Sr, Ba)Al_2O_4:Eu^{2+}$ | Blue-green to green |
| Orthosilicates | $(Sr, Ba, Ca)_2SiO_4:Eu^{2+}$ | Sr, Ba close 1:1 green<br>predominantly Sr: yellow |
| Chlorosilicates | $Ca_8Mg(SiO_4)_4Cl_2:Eu, Mn$ | With Eu: blue-green<br>With Eu,Mn: green |
| Nitridosilicates | $(Ba, Sr, Ca)_2Si_5N_8:Eu^{2+}$<br>$CaSiN_2:Eu^{2+}$<br>$CaAlSiN_3:Eu^{+2}$<br>$SrYSi_4N_7:Eu^{2+}$ | Orange to deep red |
| Oxynitrides | $(Sr, Ca)Si_2O_2N_2:Eu^{2+}$<br>$(Sr, Ba)Si_2O_2N_2:Eu^{2+}$<br>$SrSi_2O_2N_2:Eu^{2+}$<br>$BaSi_2O_2N_2:Eu^{2+}$ | Green to yellow-green<br>(yellow for Sr:Ba close to 1:1)<br><br>Green<br>Blue to green |
| Aluminium oxynitrides | $(Sr, Ba)(Al, Si)_2(O, N)_4:Eu^{2+}$<br>$(Y, Gd, Lu, Tb)_3(Al, Si)_5(O, N)_{12}:Ce^{3+}$ | Green to yellow<br>Green to yellow |

FIG 6A

| Substance group | Wavelength conversion substance | Emission |
|---|---|---|
| Orthosilicates | $(Ba, Sr, Mg)_4Si_2O_8:Eu^{2+}$ | Blue |
| Barium-containing aluminates | $BaMgAl_{10}O_{17}:Eu^{2+}$ (BAM)<br>(BAL) | Blue |
| Halophosphates | $(Sr, Ba, Ca)_5(PO_4)_3Cl:Eu^{2+}$ | Blue |

FIG 6B

OPTOELECTRONIC SEMICONDUCTOR CHIP COMPRISING A WAVELENGTH CONVERSION SUBSTANCE, AND OPTOELECTRONIC SEMICONDUCTOR COMPONENT COMPRISING SUCH A SEMICONDUCTOR CHIP, AND METHOD FOR PRODUCING THE OPTOELECTRONIC SEMICONDUCTOR CHIP

CROSS-REFERENCE TO RELATED APPLICATIONS

This application is the National Stage International Application No. PCT/DE2007/000898, filed on May 18, 2007, which claims the priority to German Patent Application Ser. No. 102006024165.7 filed on May 23, 2006. The contents of these applications are hereby incorporated by reference in their entireties.

TECHNICAL FIELD

The invention relates to an optoelectronic semiconductor chip comprising a wavelength conversion substance, to an optoelectronic component comprising such a semiconductor chip, and to a method for producing the optoelectronic semiconductor chip.

BACKGROUND

Optoelectronic semiconductor chips comprising wavelength conversion substances are described in the document WO 97/50132, for example. This document proposes applying the wavelength conversion substance to the radiation-emitting semiconductor body for example in the form of a layer embodied over a whole surface. The wavelength conversion substance of the layer converts part of the radiation emitted by the semiconductor body into radiation of other wavelengths, such that the semiconductor chip emits mixed-colored radiation, for example visible white light. Furthermore, said document also describes using not just one wavelength conversion substance but two wavelength conversion substances, for example in order to be able to better set the chromaticity coordinate of the radiation emitted by the semiconductor chip.

With the use of two or more wavelength conversion substances in conjunction with optoelectronic semiconductor bodies, however, mutual absorption can occur. If the semiconductor body emits for example radiation from the blue spectral range, which is converted partly into radiation from the red spectral range by a first wavelength conversion substance and partly into radiation from the green spectral range by a different, second wavelength conversion substance, then the radiation converted into radiation from the green spectral range by the second wavelength conversion substance can be absorbed by the second, red emitting wavelength conversion substance. This increases the internal losses of the optoelectronic semiconductor chip and thus reduces the efficiency thereof. Furthermore, the absorption of electromagnetic radiation by wavelength conversion substances is generally wavelength-selective, whereby an undesired shift in the emission spectrum of the semiconductor chip generally occurs in the case of the effect described above.

If only one wavelength conversion substance is used, then thickness fluctuations of the wavelength-converting layer generally occur on account of the limited metering accuracy. However, deviations in the thickness of the wavelength-converting layer of a few micrometers already considerably change the chromaticity coordinate of the radiation emitted by the optoelectronic semiconductor chip. Producing reproducible layer thicknesses over the entire chip area furthermore requires a high manufacturing outlay.

SUMMARY

One object of the invention is to specify an optoelectronic semiconductor chip comprising a wavelength-converting layer, the chromaticity coordinate of which can be set reproducibly in a simple manner. Further objects of the invention are to specify an optoelectronic semiconductor component comprising such a semiconductor chip and also a method for producing the optoelectronic semiconductor chip.

An optoelectronic semiconductor chip comprises, in particular:

a semiconductor body which comprises a semiconductor layer sequence suitable for emitting electromagnetic radiation of a first wavelength range from its front side, a first wavelength-converting layer on at least one first partial region of the front side of the semiconductor body with a first wavelength conversion substance, which converts radiation of the first wavelength range into radiation of a second wavelength range, which is different from the first wavelength range, wherein at least one second partial region of the front side is free of the first wavelength-converting layer.

Preferably, the area proportion of the first partial region with respect to the area proportion of the second partial region amounts to a value of between 10:1 and 1:10, inclusive of the limits. Particularly preferably, the second partial region of the front side has a value of approximately 30% relative to the total area of the front side.

In one preferred embodiment, a second wavelength-converting layer with a second wavelength conversion substance, which converts radiation of the first wavelength range into radiation of a third wavelength range, which is different from the first and second wavelength ranges, is applied on the second partial region or at least on one third partial region—different from the first partial region—of the front side of the semiconductor body. In this embodiment, two different wavelength conversion substances, which convert radiation of the first wavelength range which is generated by the semiconductor body in each case into different wavelength ranges, are arranged on different discrete partial regions of the radiation-emitting front side of the semiconductor body. This spatial separation of the two different wavelength conversion substances advantageously significantly reduces the absorption of converted radiation by the other wavelength conversion substance. In this embodiment, the first partial region and the third partial region can directly adjoin one another, that is to say have at least one common interface. As an alternative, it is also possible for at least one further partial region free of wavelength-converting layers to be arranged between the first partial region and the third partial region.

In a further preferred embodiment of the semiconductor chip, the first wavelength-converting layer converts radiation of the first wavelength range which is emitted by the semiconductor body in the first partial region completely into radiation of the second wavelength range (also called "saturated coating" hereinafter).

For a wavelength-converting layer in the form of a saturated coating, an excess of the wavelength conversion substance is set within the wavelength-converting layer, said excess preferably being dimensioned such that wavelength-converting layers having thicknesses within or equal to the range predetermined by the manufacturing tolerance always form a saturated coating.

A saturated coating preferably transmits not more than 5%, particularly preferably not more than 1%, of the radiation emitted by the semiconductor body in the region of the front side to which the wavelength-converting layer is applied.

In this case, edge regions of the wavelength-converting layer are not taken into account, which, owing to manufacturing tolerances, for example, have a smaller thickness than the rest of the wavelength-converting layer and therefore also transmit a larger proportion of the radiation generated by the semiconductor body. The width of such edge regions in which the thickness of the wavelength-converting layer deviates from the thickness thereof in the inner portion is generally less than or equal to the layer thickness of the wavelength-converting layer.

Since the emission of the semiconductor body generally does not take place in directional fashion from the front side, rather the emitting radiation forms different angles with the front side, there are furthermore at the edges of the wavelength-converting layer regions in which the radiation emitted from the front side in these regions does not pass through the complete thickness of the wavelength-converting layer but rather covers a shorter path. For these reasons, at the edges of the wavelength-converting layer, which is present in the form of a saturated coating, more unconverted radiation can penetrate through the wavelength-converting layer than in inner regions of the wavelength-converting layer.

Likewise, radiation emitted by regions of the front side of the semiconductor body which adjoin the regions to which the wavelength-converting layer is applied can penetrate through the edges of the wavelength-converting layer. This radiation, too, can contribute to edges of the wavelength-converting layer having a different emission characteristic than inner regions of the wavelength-converting layer.

The abovementioned edge effects are not taken into account any further in the present case in the description of wavelength-converting layers and the configurations thereof, such as a saturated coating, for instance.

If a second wavelength-converting layer is used, then, in one embodiment, the second wavelength-converting layer is likewise embodied such that radiation of the first wavelength range which is emitted from the front side of the semiconductor body in the partial region which is covered by the second wavelength-converting layer is completely converted into radiation of the third wavelength range. Therefore, a saturated coating is preferably once again involved in this case.

If only a single wavelength-converting layer in the form of a saturated coating is used, then the chromaticity coordinate of the radiation emitted by the semiconductor chip can be set by way of the ratio of coated to uncoated area proportion of the front side of the semiconductor body. If a plurality—for example two—of different wavelength-converting layers in the form of a saturated coating on discrete partial regions of the radiation-emitting front side of the semiconductor body are used, then the chromaticity coordinate of the radiation emitted by the optoelectronic semiconductor chip can be set by way of the area proportion of the different wavelength-converting layers with respect to one another and in relation to the uncoated area proportion of the front side.

In a further embodiment of the optoelectronic semiconductor chip, a third wavelength-converting layer with a third wavelength conversion substance, which converts radiation of the first wavelength range into radiation of a fourth wavelength range, which is different from the first, if appropriate second and if appropriate third wavelength ranges, is applied over the front side of the semiconductor body preferably directly onto the first and if appropriate the second wavelength-converting layer. In one embodiment, said third wavelength-converting layer is arranged over the whole area over the front side of the optoelectronic semiconductor chip, preferably directly on the first and if appropriate second wavelength-converting layer.

In a further embodiment, the third wavelength-converting layer too, is arranged only over at least one partial region of the front side. This can be, on the one hand, the first, the second or the third partial region or else interspaces or intersections of these partial regions.

The first, second or third wavelength-converting layer can in each case be embodied such that particles of the respective wavelength conversion substance are embedded in a binder. The binder can be selected for example from the group formed by the following materials: thermoplastic materials, polystyrene, latex, transparent rubber types, glass, polycarbonate, acrylate, Teflon, silicates, water glass, polyvinyl, silicone resin, epoxy resin, PMMA or hybrid materials comprising silicone resins, epoxy resins, or PMMA, respectively.

As an alternative, it is also possible for the respective wavelength-converting layer not to contain a binder, but rather to comprise substantially only the respective wavelength conversion substance.

In a further preferred embodiment, at least one of the first, second or third wavelength-converting layers is embodied as a film or comprised by a film which contains the respective wavelength conversion substance. If the respective wavelength-converting layer is intended to be applied only on or over at least one partial region of the front side of the semiconductor body, then said film can either be applied only on the respective partial region of the front side of the semiconductor body or be inherently prepatterned in such a way that only a partial region of the film is provided with wavelength conversion substance. In the latter embodiment, film pieces which are larger than the partial region that is to be respectively provided with wavelength-converting layer or else for example the entire front side of the semiconductor body can also be covered with the film in order to provide only a partial region over or on the front side of the semiconductor body with wavelength-converting layer.

Furthermore, it is possible for a piece of film to have two different wavelength conversion substances, each in a different discrete partial region, such that the first wavelength-converting layer is arranged in a first partial region and the second wavelength-converting layer is arranged in a second partial region of the film. This embodiment affords the advantage that the first and the second wavelength-converting layer can be applied to the front side of the semiconductor body by means of one process step.

The thickness of such a film can be for example between 10 µm and 100 µm, inclusive of the limits.

The film can be fixed for example by adhesive bonding on or above the front side of the semiconductor body.

It should be pointed out at this juncture that each of the wavelength-converting layers can be applied not only on a single respective partial region of the front side of the semiconductor body, but also on a plurality of partial regions.

In one embodiment, the first and/or the third partial region is embodied in strip-type fashion. The first wavelength-converting layer can be applied for example as a single strip on the front side or in a plurality of strips running for example parallel to one another.

If a second wavelength-converting layer is used which is likewise arranged on strip-type partial regions of the front side, then the first strip-type partial regions can alternate with the third strip-type partial regions, that is to say that a first partial region with the first wavelength-converting layer is followed by a third partial region with the second wavelength-converting layer, in such a way that correspondingly strip-type wavelength-converting layers are always situated alternately alongside one another. In this case, second strip-type partial regions between the first and third partial regions can be free of wavelength-converting layers, or in each case directly adjacent partial regions can form common interfaces.

In a further embodiment, the first and/or the second partial region is embodied in round fashion, for example in circular fashion, elliptical fashion or oval fashion.

By comparison with strip-type partial regions, partial regions which are embodied in round fashion can be arranged more simply in a statistical manner on the front side of the semiconductor body. A statistical pattern comprising round partial regions, for example, contributes to a diffuse emission characteristic of the semiconductor chip. A regular pattern, for example regularly arranged strip-type partial regions, but also regularly arranged round partial regions, can affect the emission characteristic of the semiconductor chip like a diffractive optical system.

The first, if appropriate second and/or if appropriate third wavelength conversion substance is chosen for example from the group formed by the following substances: garnets doped with rare earth metals, alkaline earth metal sulfides doped with rare earth metals, alkaline earth metal selenides doped with rare earth metals, alkaline earth metal sulfoselenides doped with rare earth metals, thiogallates or thiometals doped with rare earth metals, aluminates doped with rare earth metals, barium-containing aluminates, orthosilicates doped with rare earth metals, chlorosilicates doped with rare earth metals, nitridosilicates doped with rare earth metals, oxynitrides doped with rare earth metals, aluminum oxynitrides doped with rare earth metals, and halophosphates doped with rare earths.

Particularly preferably, a Ce-doped YAG wavelength conversion substance (YAG:Ce) is used as first, second or third wavelength conversion substance.

Furthermore, the semiconductor chip described above can be comprised by an optoelectronic semiconductor component, wherein there is disposed downstream of the semiconductor chip in the provided emission direction thereof a casting material with a fourth wavelength conversion substance, which converts radiation of the first wavelength range into radiation of a fifth wavelength range, which is different from the first, if appropriate second, if appropriate third and if appropriate fourth wavelength ranges. In this case, the semiconductor chip can be arranged for example in a recess of a component housing, wherein the casting material completely or partly fills the recess of the component housing.

A method for producing an optoelectronic semiconductor chip comprises, in particular, the following steps:

providing a semiconductor body comprising a semiconductor layer sequence suitable for emitting electromagnetic radiation of a first wavelength range, and applying a first wavelength-converting layer on at least one first partial region of the front side of the semiconductor body, which first wavelength-converting layer comprises a first wavelength conversion substance, which converts radiation of the first wavelength range into radiation of a second wavelength range, which is different from the first wavelength range, wherein at least one second partial region of the front side remains free of the first wavelength-converting layer.

In one preferred embodiment of the method, a second wavelength-converting layer with a second wavelength conversion substance, which converts radiation of the first wavelength range into radiation of a third wavelength range, which is different from the first and second wavelength ranges, is applied on at least one third partial region—different from the first partial region—of the front side.

The first and if appropriate the second and/or third wavelength-converting layer can be applied for example by means of a printing method such as screen printing, inkjet printing, relief printing or intaglio printing. Screen printing methods generally have a resolution capability of approximately 70 µm. Particularly preferably, therefore, partial regions having dimensions of between 10 µm and 1 mm are obtained by means of this printing technique. This printing technique affords the advantage that it can be carried out in a technically simple manner, reproducibly, and expediently.

The first and/or if appropriate the second and/or if appropriate the third wavelength-converting layer can furthermore be applied by means of a lithographic method. For this purpose, the radiation-emitting front side of the semiconductor body is first coated with a photoresist, which can generally be patterned with a resolution of less than or equal to 100 nm. The photoresist layer is patterned with the desired pattern by means of an exposure step and, in a succeeding step, the surface is covered with the respective wavelength-converting layer. If the wavelength-converting layer is a layer comprising a binder, then the wavelength conversion substance is introduced into the binder and this mixture is applied in a layer on the photoresist layer, for example by spin-coating. The residual photoresist is subsequently stripped away in such a manner that the wavelength-converting layer forms the inverse pattern of the photoresist layer. Generally very high resolutions, for example, of less than or equal to 100 nm can be achieved by means of a lithographic method.

By means of a printing method, the wavelength-converting layers can advantageously be applied in a patterned manner in one method step. In contrast to lithographic methods, no photoresist mask is necessary. However, lithographic methods generally afford a higher resolution than printing methods.

Furthermore, the first and/or if appropriate the second and/or if appropriate the third wavelength-converting layer can also be applied using an electrophoretic process. For this purpose, the semiconductor body is partly coated with an insulating resist, for example with a photoresist by means of the lithographic method described above. Afterward, through the influence of an electric field, wavelength conversion substance is deposited from a liquid phase directly on the front side of the semiconductor body in the partial regions not coated with resist. In this way it is possible to produce a wavelength-converting layer without a binder.

Furthermore, it is also possible to apply to the partial regions of the front side which are to be coated, instead of the photoresist layer, a conductive coating as electrode, on which the respective wavelength conversion substance is added in patterned fashion during the electrophoresis. Said conductive coating is preferably transmissive to the radiation emitted by the semiconductor body. Said conductive coating can be for example a coating which comprises or consists of a transparent conductive oxide (TCO). Transparent conductive oxides ("TCO" for short) are transparent conductive materials, generally metal oxides, such as, for example, zinc oxide, tin oxide, cadmium oxide, titanium oxide, indium oxide or indium tin oxide (ITO). In addition to binary metal-oxygen compounds, such as, for example, $ZnO$, $SnO_2$ or $In_2O_3$, ternary metal-oxygen compounds, such as, for example, $Zn_2SnO_4$, $CdSnO_3$, $ZnSnO_3$, $MgIn_2O_4$, $GaInO_3$, $Zn_2In_2O_5$ or $In_4Sn_3O_{12}$, or mixtures of different transparent conductive oxides, also belong to the group of TCOs. Furthermore, the TCOs do not necessarily correspond to a stoichiometric composition and can also be p- or n-doped.

As already described further above, it is furthermore also possible for the first and/or if appropriate the second and/or if appropriate the third wavelength-converting layer to be applied as a film. This is preferably done by adhesive bonding. This method affords the advantage that it is generally particularly cost-effective.

The film material can be selected for example from the group formed by the following materials: thermoplastic materials, polystyrene, latex, transparent rubber types, polycarbonate, acrylate, Teflon, polyvinyl, silicone resin, epoxy resin, PMMA or hybrid materials comprising silicone resins, epoxy resins, or PMMA, respectively.

A thin-film semiconductor body is preferably used as the semiconductor body.

A thin-film semiconductor body is distinguished in particular by at least one of the following characteristic features:
- a reflective layer is applied or formed at a first main face—facing toward a carrier element—of a radiation-generating epitaxial layer sequence as semiconductor layer sequence, said reflective layer reflecting at least part of the electromagnetic radiation generated in the epitaxial layer sequence back into the latter;
- the thin-film semiconductor body comprises a carrier element, which is not the growth substrate on which the epitaxial layer sequence was grown epitaxially, but rather a separate carrier element which was subsequently fixed to the epitaxial layer sequence,
- the growth substrate of the epitaxial layer sequence is removed from the epitaxial layer sequence or thinned in such a way that together with the epitaxial layer sequence alone it is not self-supporting, or
- the epitaxial layer sequence has a thickness in the region of 20 µm or less, in particular in the region of 10 µm.

The carrier element is preferably embodied such that it is transmissive to a radiation emitted by the semiconductor chip.

Furthermore the epitaxial layer sequence preferably contains at least one semiconductor layer having at least one area having an intermixing structure which ideally leads to an approximately ergodic distribution of the light in the epitaxial layer sequence, that is to say that it has an as far as possible ergodically stochastic scattering behavior.

A basic principle of a thin-film semiconductor body is described for example, in I. Schnitzer et al. Appl. Phys. Lett. 63 (16), Oct. 18, 1993, 2174-2176, the disclosure content of which in this respect is hereby incorporated by reference.

A thin-film semiconductor body is to a good approximation a Lambertian surface emitter and is therefore suitable in particular for application in a headlight. The use of a thin-film semiconductor body affords the advantage that the latter generally has a plane radiation-emitting front side which can be provided with the wavelength-converting layer(s) in a simple manner by means of the techniques described above, such as screen printing for example.

The invention is explained in more detail below on the basis of various exemplary embodiments in conjunction with FIGS. 1A to 6B.

DETAILED DESCRIPTION

In the exemplary embodiments and figures, identical or identically acting constituent parts are in each case provided with the same reference symbols. The elements illustrated should in principal not be regarded as true to scale; rather, individual elements such as, for example, layer thicknesses or structure sizes may be illustrated with an exaggerated size in order to afford a better understanding.

Figure 1A:
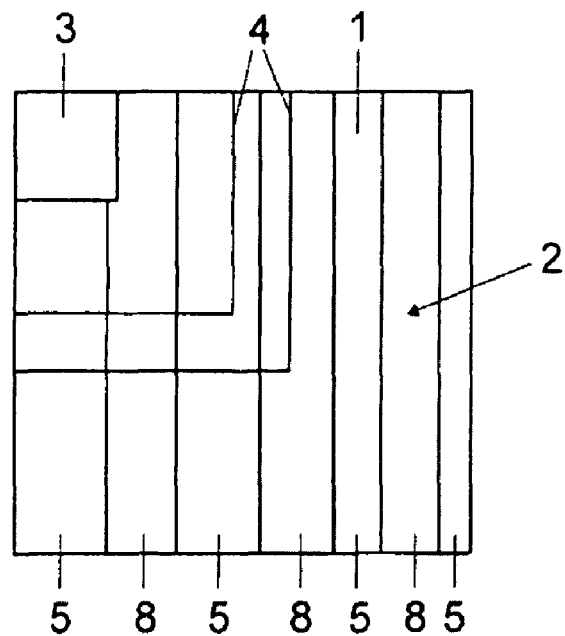
FIGS. 1A to 1C show schematic illustrations of the semiconductor chip in accordance with different production steps of the method.

The semiconductor body 1 in accordance with FIG. 1A has, on its radiation-emitting front side 2, a bond pad 3 for subsequent electrical contact-making and also interconnects 4 for better impressing current into the semiconductor body 1. The semiconductor body 1 can be for example a light-emitting diode body.

Furthermore, the semiconductor body 1 has a semiconductor layer sequence having an active radiation-generating zone, which comprises for example a pn junction, a double heterostructure, a single quantum well structure or a multiple quantum well structure for generating radiation. The semiconductor layer sequence can be grown epitaxially, for example, for instance on a growth substrate. Examples of quantum well structures are described in the documents WO 01/39282, WO 98/31055, U.S. Pat. No. 5,831,277, EP 1 017 113 and U.S. Pat. No. 5,684,309 the disclosure content of which in this respect is hereby incorporated by reference.

The semiconductor body 1 is based for example on a III/V compound semiconductor material such as an arsenide, a phosphide or a nitride compound semiconductor material, that is to say that at least one layer of the semiconductor layer sequence, preferably the active zone, comprises or consists of a nitride, phosphide or arsenide compound semiconductor material.

Nitride compound semiconductor materials are compound semiconductor materials which contain nitrogen, such as, for example, materials from the system $In_xAl_yGa_{1-x-y}N$ where $0 \leq x \leq 1$, $0 \leq y \leq 1$ and $x+y \leq 1$. Phosphide compound semiconductor materials are compound semiconductor materials which contain phosphorous, such as, for example, materials from the system $In_xAl_yGa_{1-x-y}P$ where $0 \leq x \leq 1$, $0 \leq y \leq 1$ and $x+y \leq 1$ while arsenide compound semiconductor materials are compound semiconductor materials which contain arsenic, such as, for example, materials from the system $In_xAl_yGa_{1-x-y}As$ where $0 \leq x \leq 1$, $0 \leq y \leq 1$ and $x+y \leq 1$.

Figure 1B:
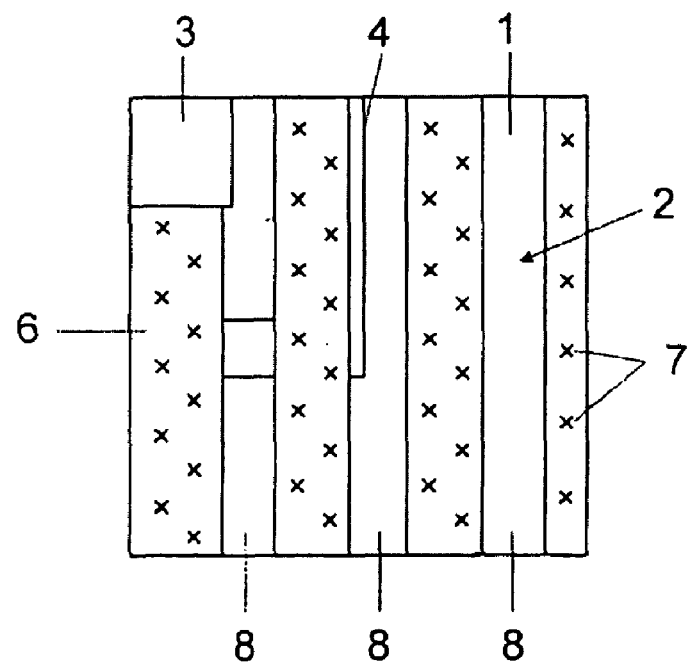

In order to produce the semiconductor chip 18 in accordance with the exemplary embodiment in FIGS. 1C and 1D (which will be described in detail below) proceeding from the semiconductor body 1 in accordance with FIG. 1A, a first wavelength-converting layer 6 with a first wavelength conversion substance 7 is applied to first partial regions 5 of a radiation-emitting front side 2 of the semiconductor body 1, wherein second partial regions 8 of the radiation-emitting front side 2 remain free of the first wavelength-converting layer 6 (see FIG. 1B). In the present case, the first wavelength-converting layer 6 comprises, besides particles of the first wavelength conversion substance 7, a binder, for example, one of the materials already presented in the general part of the description. Furthermore, the first and also second partial regions 5, 8 of the front side 2 of the semiconductor body 1 are embodied in strip-type fashion in the present exemplary embodiment.

Figure 1C:
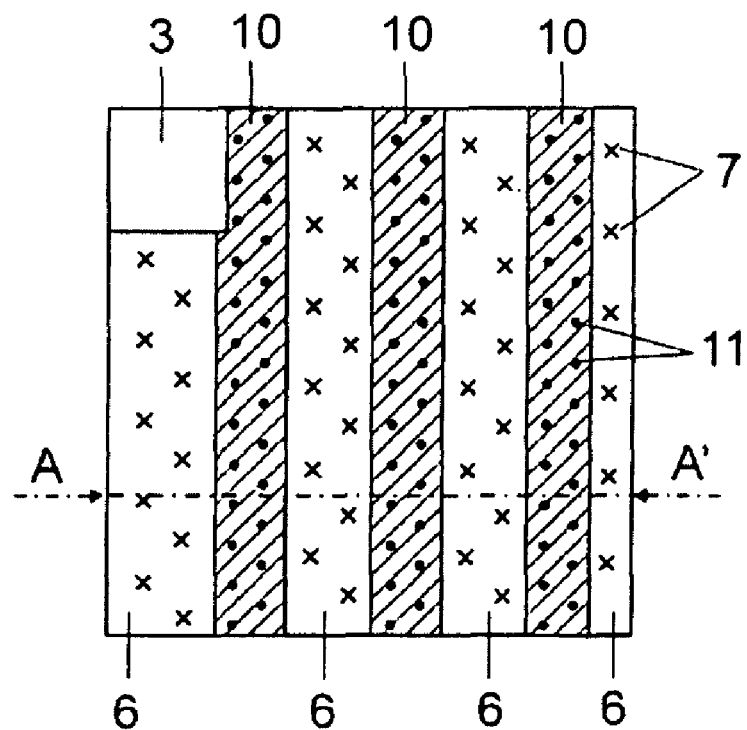
Figure 1D:
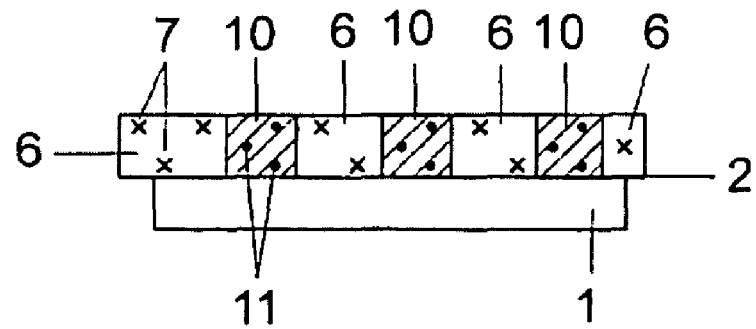
FIG. 1D shows a schematic sectional view of the semiconductor chip from FIG. 1C along the line AA'.

In a further step, a second wavelength-converting layer 10 is applied in third partial regions 9 of the radiation-emitting front side 2, which in the present case are identical to the second partial regions 8 of the radiation-emitting front side 2, said second wavelength-converting layer, like the first wavelength-converting layer 6, containing a binder besides particles of the second wavelength conversion substance 11 (FIGS. 1C and 1D).

The wavelength-converting layers 6, 10 can be applied for example with the aid of a printing method, such as screen printing or inkjet printing.

By means of screen printing, it is possible to apply for example wavelength conversion substance/binder suspensions as wavelength-converting layers 6, 10 which comprise garnets, oxynitrides or nitridosilicates as wavelength conversion substances 7, 11 having a solids proportion of between 50% by volume and 70% by volume. The wavelength conversion substances 7, 11 used preferably have a $d_{50}$ value (median) of less than or equal to 15 µm.

As an alternative, one of the two wavelength-converting layers 6, 10, for example the first wavelength-converting layer 6, can be applied to the radiation-emitting front side 2 of the semiconductor body 1 by means of a lithographic method. For this purpose, a photoresist layer is applied to the front side 2 of the semiconductor body 1, said photoresist layer being subdivided into first and second partial regions 5, 8 by means of an exposure step. With the aid of a development step, the photoresist on the first partial regions 5 of the front side 2 of the semiconductor body 1 is stripped away, in such a manner that second partial regions 8 of the front side 2 are free of the photoresist layer. In a further step, the first wavelength-converting layer 6 is applied to the prepatterned front side 2 of the semiconductor body 1 over the whole area and the photoresist is stripped away. As a result of the removal of the photoresist in the second partial regions 8 of the front side 2, the overlying first wavelength-converting layer 6 is likewise removed here, in such a manner that the first wavelength-converting layer 6 is formed only in the first partial regions 5 of the front side 2 and the second partial regions 8 of the front side 2 are free of the first wavelength-converting layer 6.

If the first wavelength-converting layer 6 as mentioned above, furthermore comprises a binder besides particles of the first wavelength conversion substance 7, then the binder/wavelength conversion substance mixture can be applied for example to the prepatterned photoresist layer by means of a spin-coating method, blade coating or by means of spraying.

If the intention is to apply a wavelength-converting layer 6, 10 which essentially only consists of particles of the respective wavelength conversion substance 7, 11, then this can be applied for example to a conductive electrode on the front side 2 of the semiconductor body 1, which is transmissive to the radiation emitted by the semiconductor body 1. In this case, the electrode is applied on the partial regions of the front side which are intended to be covered with the wavelength-converting layer. The electrode can be a TCO coating, for example, as has already been described in the general part of the description. Afterward, the semiconductor body 1 prepatterned with the electrode is introduced into a suspension comprising the wavelength conversion substance of the wavelength-converting layer to be applied and an electrical voltage, for example of between 50 V and 200 V, is applied, in such a way that the particles of the wavelength conversion substance are added to the front side 2 of the semiconductor body 1.

Furthermore, it is also possible to apply one or both wavelength-converting layers 6, 10 to the radiation-emitting front side 2 of the semiconductor body 1 as a film, for example by means of adhesive bonding. In this case, either film pieces having the dimensions of the individual partial regions to be coated can be arranged on the respective partial regions, or a prepatterned film having the first wavelength conversion substance 7 only in first partial regions 5 can be applied to the front side 2, for example in area covering fashion. If the intention is to apply two different wavelength-converting layers 6, 10 to first and third partial regions 5, 9, it is possible for example to use a prepatterned film having a first wavelength conversion substance 7 in first partial regions 5 and a second wavelength conversion substance 11 in third partial regions 9.

Such a prepatterned film can be produced as follows: on a working surface, for example composed of Teflon, the respectively desired wavelength conversion substance is applied in patterned fashion, for instance by means of a printing method. In a further step, the film material is cast on and crosslinked in a third step. The film material can be silicone, for example. The film is subsequently removed again from the working surface.

Furthermore, one of the following materials can be chosen as film material: thermoplastic materials, polystyrene, latex, transparent rubber types, polycarbonate, acrylate, Teflon, polyvinyl, silicone resin, epoxy resin, PMMA or hybrid materials comprising silicone resins, epoxy resins or PMMA.

In the semiconductor chip 18 in accordance with the exemplary embodiment in FIGS. 1C and 1D, the first and the second wavelength-converting layer 6, 10 are arranged in such a way that they form common interfaces with the respectively adjacent layer. In the present case, a nitride-based semiconductor body 1 is used, which emits electromagnetic radiation of a first wavelength range from the blue spectral range during operation. One portion of this radiation emitted by the semiconductor body 1 is converted by the first wavelength conversion substance 7 of the first wavelength-converting layer 6 into radiation of a second wavelength range, in the present case from the green spectral range, which is different from the first wavelength range. Another portion of the blue radiation emitted by the semiconductor body 1 passes through the first wavelength-converting layer 6 without being converted. Consequently, the first wavelength-converting layer 6 of the exemplary embodiment in accordance with FIGS. 1B to 1D is not a saturated coating. The second wavelength-converting layer 10, too, is not a saturated coating in the present case. One portion of the radiation from the blue spectral range that is emitted by the semiconductor body 1 also passes through the second wavelength-converting layer 10 without being converted, while another portion of the radiation emitted by the semiconductor body 1 is converted by the second wavelength conversion substance 11 of the second wavelength-converting layer 10 into red radiation. Wavelength conversion substances suitable for being used as first and as second wavelength conversion substance can be gathered from the table in FIG. 6A. The semiconductor body 1 in FIGS. 1C and 1D emits mixed-colored radiation comprising radiation of the first, second and third spectral ranges, the chromaticity coordinate of which lies for example in the white region of the CIE standard chromaticity diagram.

Figure 1E:
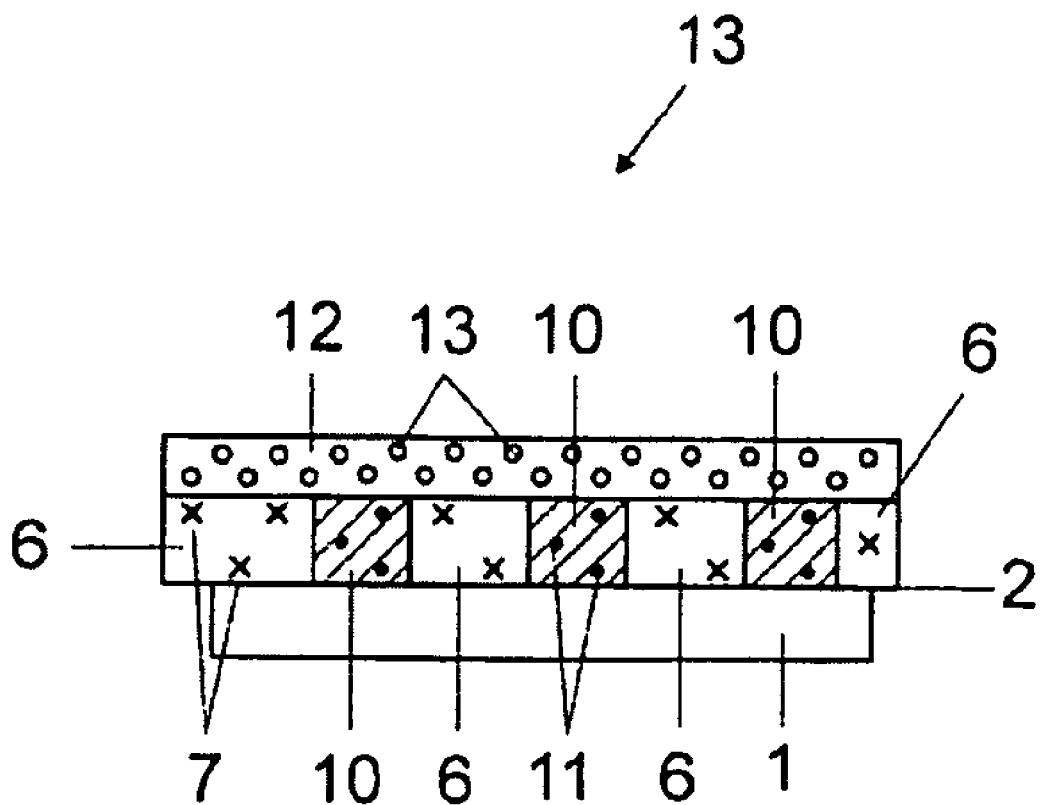
FIG. 1E shows a schematic sectional view of a semiconductor chip in accordance with a second exemplary embodiment.

In the semiconductor chip 18 in accordance with the exemplary embodiment in FIG. 1E, in contrast to the semiconductor chip 18 in FIGS. 1C and 1D, a third wavelength-converting layer 12 with a third wavelength conversion substance 13 is applied. Said third wavelength conversion substance 13 is suitable for converting part of the radiation of the first wavelength range that is emitted by the semiconductor body 1 into radiation of a third wavelength range, which is different from the first and second wavelength ranges. In the exemplary embodiment in accordance with FIG. 1E, the third wavelength-converting layer 12 is applied in area covering fashion over the front side 2 of the semiconductor body 1 in direct contact with the first and the second wavelength-converting layer 6, 10. Said third wavelength-converting layer 12 can be applied by means of spin-coating or blade coating, for example. Furthermore, it is also possible to apply the third wavelength-converting layer 12 only in partial regions, that is to say in patterned fashion. The methods already described above in connection with the first and the second wavelength-converting layer 6, 10 are suitable for this purpose, for example.

Such a third wavelength-converting layer 12 is suitable, in particular, for being used in conjunction with a semiconductor body 1 that emits radiation of a first wavelength range, comprising ultraviolet radiation. In this case, the first wavelength-converting layer 6 can comprise for example a first wavelength conversion substance 7 suitable for converting part of the radiation of the first wavelength range into radiation of a second wavelength range from the red spectral range, and the second wavelength-converting layer 10 can comprise a second wavelength conversion substance 11 suitable for converting part of the radiation of the first wavelength range into radiation of a third wavelength range from the green spectral range. The third wavelength-converting layer 12 preferably comprises a third wavelength conversion substance 13 suitable for converting ultraviolet radiation from the first wavelength range into radiation of a fourth wavelength range from the blue spectral range. In this case the semiconductor chip 18 emits mixed-colored radiation comprising radiation from the red, green and blue spectral ranges. Wavelength conversion substances which are suitable for converting radiation from the ultraviolet spectral range into radiation from the blue spectral range and which can therefore be used as third wavelength conversion substance in the present case can be gathered from FIG. 6B, for example.

If the third wavelength-converting layer 12 is used for example in conjunction with a semiconductor body 1 that emits radiation of a first wavelength range from the blue spectral range, then the third wavelength conversion substance 13 of the third wavelength-converting layer 12 preferably suitable for converting radiation of the first blue wavelength range into radiation of a fourth wavelength range from the blue-green spectral range. In this case, the second and third wavelength ranges can likewise be chosen, for example, as already described above, in such a way that the second wavelength range originates from the red spectral range and the third wavelength range originates from the green spectral range. In this case, the semiconductor chip 18 emits mixed-colored radiation which comprises red, blue and green radiation and the chromaticity coordinate of which preferably lies in the white region of the CIE standard chromaticity diagram.

Figure 2A:
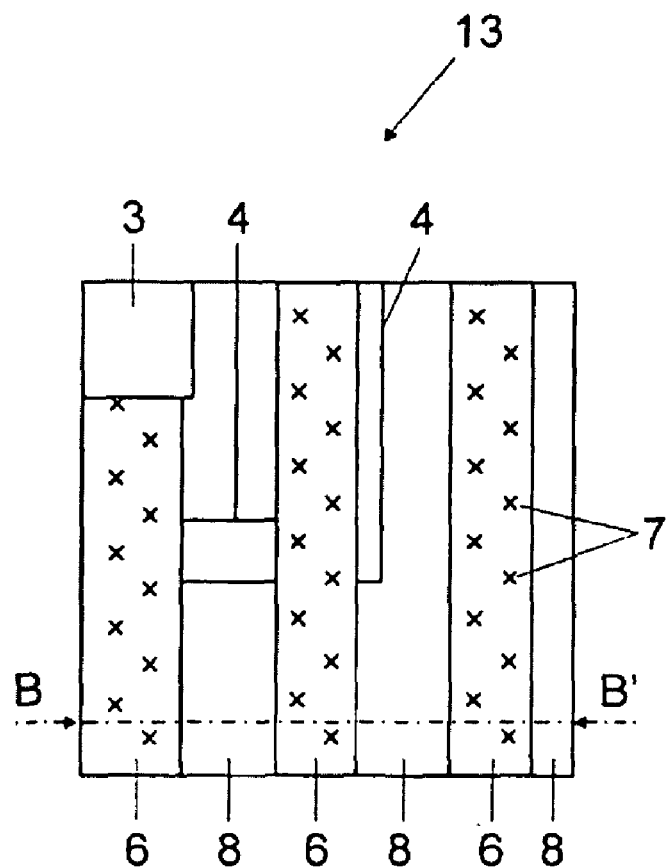
FIG. 2A shows a schematic plan view of a semiconductor chip in accordance with a third exemplary embodiment.
Figure 2B:
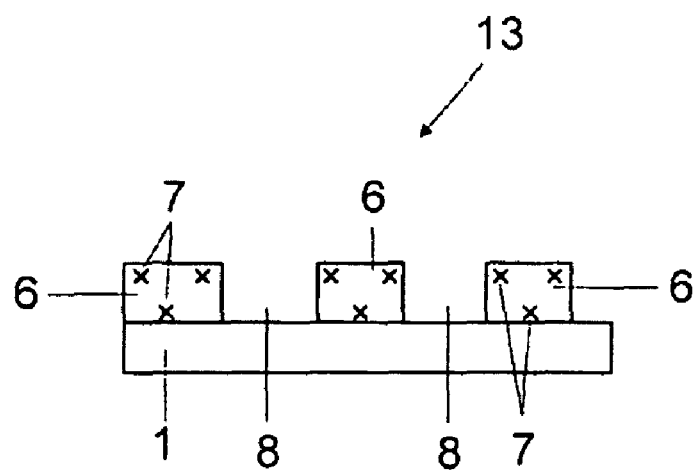
FIG. 2B shows a schematic sectional illustration of the semiconductor chip from FIG. 2A along the line BB'.

In the semiconductor chip 18 in accordance with the exemplary embodiment in FIGS. 2A and 2B, in contrast to the semiconductor chip 18 in accordance with the exemplary embodiment in FIGS. 1C and 1D, only a first wavelength-converting layer 6 is applied on first strip-type partial regions 5 of the radiation-emitting front side 2 of the semiconductor body 1, and no second wavelength-converting layer 10 is used. The second partial regions 8 of the front side are therefore completely free of any wavelength conversion layer. The first wavelength-converting layer 6 in this exemplary embodiment, in contrast to the first wavelength-converting layer 6 in the exemplary embodiment in FIGS. 1C and 1D is present in the form of a saturated coating. This means that radiation from the semiconductor body 1 which is emitted from the first partial regions of the front side is completely converted into radiation of the second wavelength range. In the present case, the semiconductor body 1 emits radiation of a first wavelength range from the blue spectral range and the first wavelength conversion substance 7 converts this blue radiation of the first wavelength range into radiation of the second wavelength range, in the present case from the yellow spectral range. In this case, YAG:Ce, for example, is suitable as first wavelength conversion substance. In the present case, the proportions of coated to uncoated area, that is say of first to second partial regions 5, 8, are selected in such a way that the semiconductor chip 18 emits mixed-colored radiation having a chromaticity coordinate in the white region of the CIE standard chromaticity diagram.

A first wavelength-converting layer comprising YAG:Ce as first wavelength conversion substance is present for example in the form of a saturated coating if the first wavelength conversion substance has a concentration of approximately 75% by weight in the binder and the first wavelength-converting layer has a thickness of approximately 50 µm. If the thickness and/or the concentration of the first wavelength conversion substance are/is reduced, then the first wavelength-converting layer loses the form of a saturated coating.

Figure 3A:
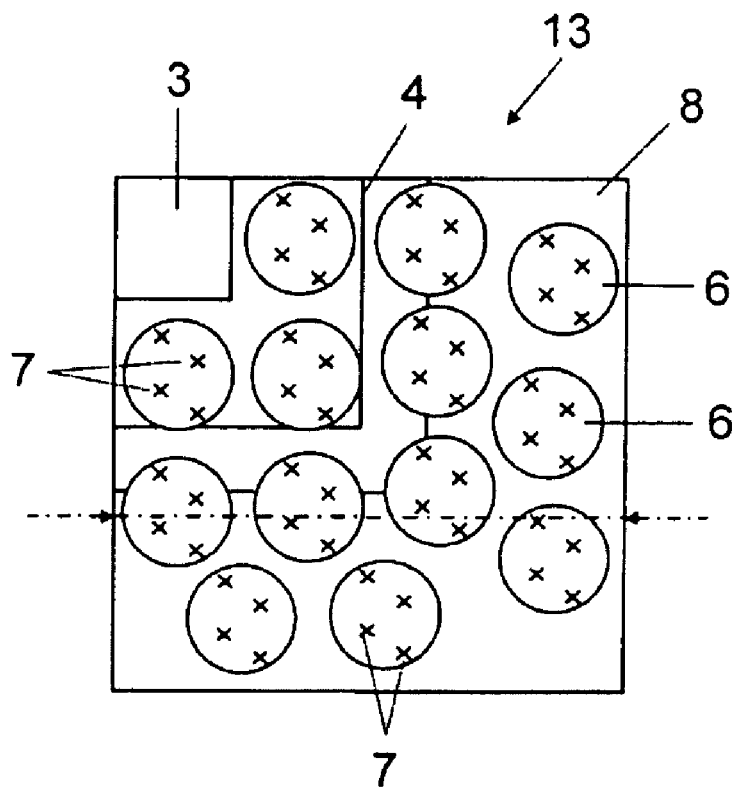
FIG. 3A shows a schematic plan view of a semiconductor chip in accordance with a fourth exemplary embodiment.
Figure 3B:
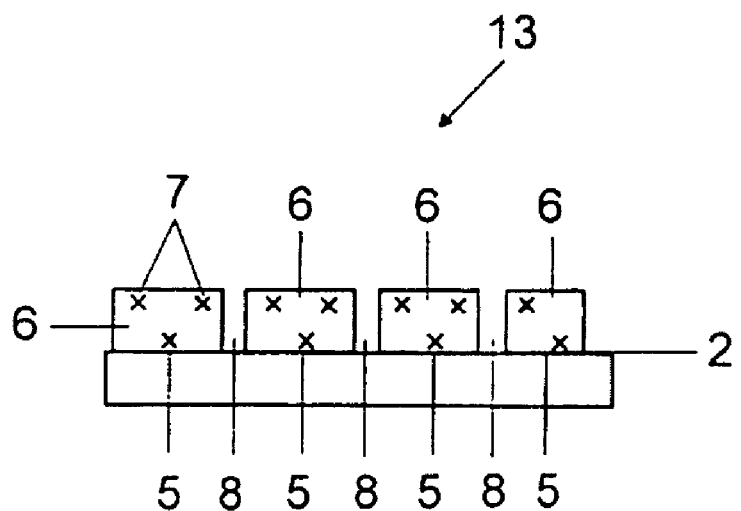
FIG. 3B shows a schematic sectional illustration through the semiconductor chip from FIG. 3A along the line CC'.

The semiconductor chip 18 in accordance with the exemplary embodiment in FIGS. 3A and 3B, in contrast to the semiconductor chip 18 in accordance with FIGS. 2A and 2B has a first wavelength-converting layer 6 on the front side 2 of the radiation-emitting semiconductor body 1 which is applied on round, in the present case circular, first partial regions 5. The semiconductor body 1 once again emits electromagnetic radiation of a first wavelength range from the blue spectral range, which is converted by the first wavelength-converting layer 6 into radiation of a second wavelength range from the yellow spectral range. The wavelength conversion substance YAG:Ce, for example, is suitable for this purpose. As in the exemplary embodiment in FIGS. 2A and 2B, the first wavelength-converting layer 6 is a saturated coating, that is to say that radiation emitted by the semiconductor body in the first partial regions 5 is completely converted by the first wavelength-converting layer 6 into radiation of the second wavelength range, in the present case from the yellow spectral range. In the present case the area proportion of coated front side to uncoated front side is set for example in such a way that the semiconductor chip 18 emits mixed-colored radiation from the white region of the CIE standard chromaticity diagram.

Figure 4A:
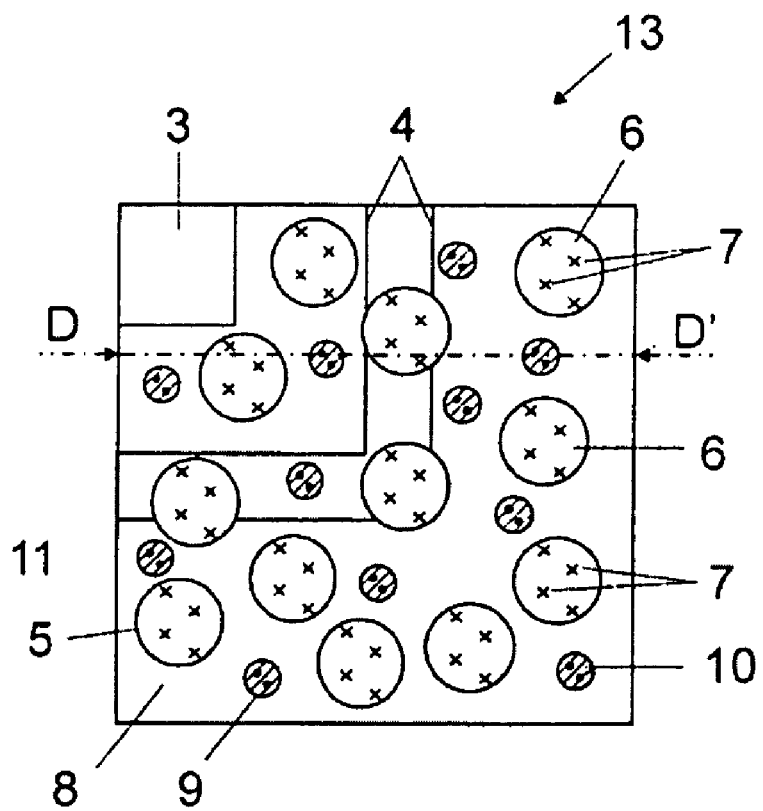
FIG. 4A shows a schematic plan view of a semiconductor chip in accordance with a fifth exemplary embodiment.
Figure 4B:
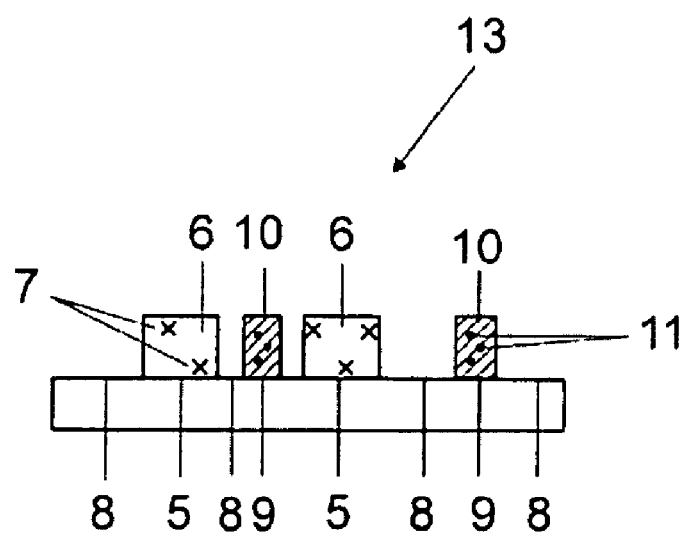
FIG. 4B shows a schematic sectional illustration of the semiconductor chip in accordance with FIG. 4a along the line DD'.

In the semiconductor body in accordance with the exemplary embodiment in FIGS. 4A and 4B, in contrast to the semiconductor chip 18 in accordance with FIG. 3A, in addition to the first wavelength-converting layer 6 in the form of a saturated coating on the first partial regions 5 of the radiation-emitting front side 2 of the semiconductor body 1, a second wavelength-converting layer 10 likewise in the form of a saturated coating is used, which, in the present case is applied on third partial regions 9 of the radiation-emitting front side 2. The third partial regions 9 lie within the second partial regions 8, which are free of the first wavelength-converting layer 6 and are embodied in circular fashion like the first partial regions 5, but have a smaller radius than the first partial regions 5. In this exemplary embodiment, too, the semiconductor body 1 emits radiation of a first wavelength range from the blue spectral range. Blue radiation from the first wavelength range that is emitted by the first partial regions is completely converted by the first wavelength conversion substance 7 of the first wavelength-converting layer 6 into radiation of a second wavelength range from the yellow spectral range, while blue radiation from the first wavelength range that is emitted by the partial regions of the front side of the semiconductor body on which the second wavelength-converting layer is applied is completely converted into radiation of a third wavelength range from the green spectral range. Suitable wavelength conversion substances can be gathered from FIG. 6A, for example. The semiconductor chip 18 thus emits mixed radiation comprising blue unconverted radiation and also converted yellow and green radiation. The area proportion of the coated first and third partial regions 5, 9 with respect to one another and the uncoated proportion of the radiation-emitting front side with respect to the coated proportion once again determines the chromaticity coordinate of the radiation that is emitted by the semiconductor chip 18, said chromaticity coordinate preferably lying in the white region of the CIE standard chromaticity diagram.

Figure 5A:
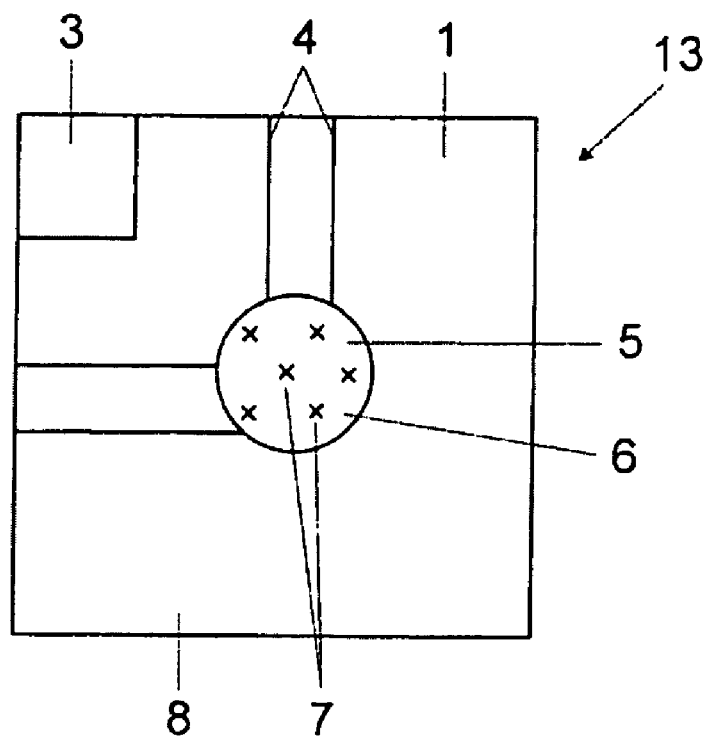
FIG. 5A shows a schematic plan view of a semiconductor chip in accordance with a sixth exemplary embodiment.

In the semiconductor body in accordance with the exemplary embodiment in FIG. 5a, in contrast to the previous exemplary embodiments, the first wavelength-converting layer 6 is arranged only on a single first partial region 5 of the radiation-emitting front side 2 of the semiconductor body 1. In the present case, said partial region is embodied in circular fashion. The first wavelength-converting layer 6 is present in the form of a saturated coating that converts part of the radiation of the first wavelength range from the blue spectral range that is emitted by the semiconductor body 1 into radiation of a second wavelength range from the red spectral range.

Figure 5B:
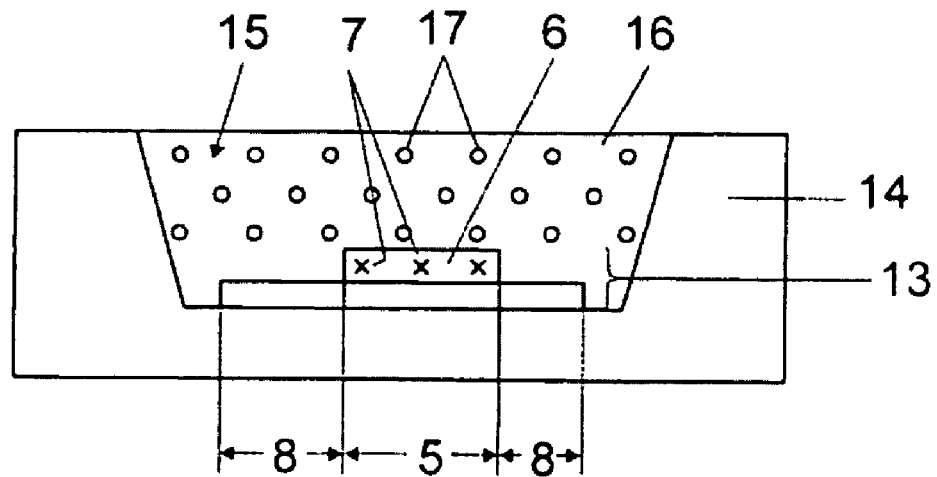
FIG. 5B shows a schematic sectional illustration through a component in accordance with a first exemplary embodiment with the semiconductor chip in accordance with FIG. 5A, and FIGS. 6A and 6B show tabular listings of various wavelength conversion substances.

The semiconductor body in accordance with FIG. 5A, just like the other semiconductor chips 18 already described, can be used for example, in a component. In the component in accordance with the exemplary embodiment in FIG. 5B, the semiconductor chip 18 in accordance with FIG. 5A is mounted in a recess 15 of a component housing 14. A casting compound 16 comprising a fourth wavelength conversion substance 17 is filled into the recess 15 of the component housing 14. In the present case, the fourth wavelength conversion substance 17 is embedded into a matrix material, for example, a silicone or epoxy resin. The fourth wavelength conversion substance 17 is suitable for converting blue radiation from the first wavelength range that is emitted by the semiconductor chip 18 into radiation of a fourth wavelength range, in the present case from the yellow spectral range. In the present case, only a small portion of the yellow converted radiation is absorbed by the first, red emitting wavelength conversion substance 6, since the relative area proportion coated with first, red wavelength conversion substance 6 is very small, preferably less than 30%.

FIGS. 6A and 6B show tabular listings of wavelength conversion substances which have been selected by way of example and which can be used for example in the exemplary embodiments described above. In this case, the wavelength conversion substances in FIG. 6A can all be excited at least by radiation from the blue spectral range, while the wavelength conversion substances in FIG. 6B can be excited at least by radiation from the ultraviolet spectral range. Chemical elements which are indicated between parentheses can be used in a manner mixed in wide ranges, wherein the total number of atoms must be equal to the value indicated at the parenthesis. If no number is indicated at the parenthesis, then the total number of atoms must result as one.

It should be pointed out at this juncture that the expression "a second partial region is free of the first wavelength-converting layer" is taken to mean that at least one essential second partial region of the front side is not covered with said layer. As a result, an essential proportion of the radiation emitted by the semiconductor body in this partial region is not converted by the first wavelength-converting layer and is available either for being mixed with the already converted radiation, such that mixed-colored radiation arises, or for being at least partly converted for its part by a further wavelength conversion substance, such that mixed-colored radiation likewise arises. In particular, the expression "a second partial region is free of the first wavelength-converting layer" is not taken to mean partial regions which arise as a secondary effect during production, for example, and do not contribute further to the function of the semiconductor chip.

The invention is not restricted by the description on the basis of the exemplary embodiments. Rather, the invention encompasses any new feature and also any combination of features, which in particular comprises any combination of features in the patent claims, even if this feature or this combination itself is not explicitly specified in the patent claims or exemplary embodiments.

The invention claimed is:

1. An optoelectronic semiconductor chip comprising:
a semiconductor body which comprises a semiconductor layer sequence suitable for emitting electromagnetic radiation of a first wavelength range from its front side,
a first wavelength-converting layer on at least one first partial region of the front side of the semiconductor body with a first wavelength conversion substance, which converts radiation of the first wavelength range into radiation of a second wavelength range, which is different from the first wavelength range, wherein at least one second partial region of the front side is free of the first wavelength-converting layer and wherein the first wavelength-converting layer is embodied as a prefabricated film or comprises a prefabricated film which contains the first wavelength conversion substance.

2. The optoelectronic semiconductor chip as claimed in claim 1, wherein a second wavelength-converting layer with a second wavelength conversion substance, which converts radiation of the first wavelength range into radiation of a third wavelength range, which is different from the first and second wavelength ranges, is applied on the second partial region or at least on one third partial region—different from the first partial region—of the front side.

3. The optoelectronic semiconductor chip as claimed in claim 2, wherein the second wavelength-converting layer converts radiation of the first wavelength range, which is emitted from the front side of the semiconductor body in the partial region to which the second wavelength-converting layer is applied, completely into radiation of the third wavelength range.

4. The optoelectronic semiconductor chip as claimed in claim 2, wherein a third wavelength-converting layer with a third wavelength conversion substance, which converts radiation of the first wavelength range into radiation of a fourth wavelength range, which is different from the first, second, and third wavelength ranges, is applied over the front side of the semiconductor body.

5. The optoelectronic semiconductor chip as claimed in claim 4, wherein the third wavelength-converting layer comprises a binder into which particles of the third wavelength conversion substance are embedded.

6. The optoelectronic semiconductor chip as claimed in claim 4, wherein the third wavelength-converting layer is embodied as a prefabricated film or comprises a prefabricated film which contains the third wavelength conversion substance.

7. The optoelectronic semiconductor chip as claimed in claim 2, wherein the second wavelength-converting layer comprises a binder into which particles of the second wavelength conversion substance are embedded.

8. The optoelectronic semiconductor chip as claimed in claim 2, wherein the second wavelength-converting layer is embodied as a prefabricated film or comprises a prefabricated film which contains the second wavelength conversion substance.

9. The optoelectronic semiconductor chip as claimed in claim 2, wherein the third partial region is embodied in strip-type fashion.

10. The optoelectronic semiconductor chip as claimed in claim 2, wherein the third partial region is embodied in round fashion.

11. The optoelectronic semiconductor chip as claimed in claim 1, wherein the first wavelength-converting layer converts radiation of the first wavelength range, which is emitted by the first partial region, completely into radiation of the second wavelength range.

12. The optoelectronic semiconductor chip as claimed in claim 1, wherein the first wavelength-converting layer comprises a binder into which particles of the first wavelength conversion substance are embedded.

13. The optoelectronic semiconductor chip as claimed in claim 12, wherein the binder is selected from the group formed by the following materials: thermoplastic materials, polystyrene, latex, transparent rubber types, glass, polycarbonate, acrylate, Teflon, silicates, water glass, polyvinyl, silicone resin, epoxy resin, PMMA or hybrid materials comprising silicone resin, epoxy resin and PMMA.

14. The optoelectronic semiconductor chip of claim 12, wherein the particles of the first wavelength conversion substance comprise a material chosen from the group consisting of garnets doped with rare earth metals, alkaline earth metal sulfides doped with rare earth metals, alkaline earth metal selenides doped with rare earth metals, alkaline earth metal sulfoselenides doped with rare earth metals, thiogallates or thiometals doped with rare earth metals, aluminates doped with rare earth metals, barium-containing aluminates, orthosilicates doped with rare earth metals, chlorosilicates doped with rare earth metals, nitridosilicates doped with rare earth metals, oxynitrides doped with rare earth metals, aluminum oxynitrides doped with rare earth metals, and halophosphates doped with rare earths.

15. The optoelectronic semiconductor chip as claimed in claim 1, wherein the prefabricated film is bonded onto the front side by means of an adhesive.

16. The optoelectronic semiconductor chip as claimed in claim 1, wherein the first partial region is embodied in strip-type fashion.

17. The optoelectronic semiconductor chip as claimed in claim 1, wherein the first partial region has a circular, elliptical or oval outline in plan view of the front side.

18. An optoelectronic semiconductor component comprising a semiconductor chip as claimed in claim 1, disposed downstream of which, in the provided emission direction thereof, is a casting material with a fourth wavelength conversion substance, which converts radiation of the first wavelength range into radiation of a fifth wavelength range, which is different from the first, and second, wavelength ranges.

19. An optoelectronic semiconductor component comprising:
    a semiconductor body which comprises a semiconductor layer sequence suitable for emitting electromagnetic radiation of a first wavelength range from its front side,
    a first wavelength-converting layer with a first wavelength conversion substance, which converts radiation of the first wavelength range into radiation of a second wavelength range, which is different from the first wavelength range,
    a second wavelength-converting layer with a second wavelength conversion substance, which converts radiation of the first wavelength range into radiation of a third wavelength range, which is different from the first and second wavelength ranges, and
    a third wavelength-converting layer,
    wherein the first wavelength-converting layer and the second wavelength-converting layers are arranged on different partial regions of the front side of the semiconductor body and the third wavelength-converting layer is arranged over the front side of the semiconductor body such that it covers the first and second wavelength-converting layers.

20. The optoelectronic semiconductor component of claim 19, wherein the third wavelength-converting layer covers the whole front side of the semiconductor body.

21. The optoelectronic semiconductor component of claim 19 wherein the third wave-length converting layer is arranged directly on the first and second wavelength-converting layers.

22. The optoelectronic semiconductor component of claim 19 wherein at least one further partial region of the front side is free of the first and second wavelength-converting layers.

23. The optoelectronic semiconductor component of claim 19 further comprising a casting material with a fourth wavelength conversion substance, which converts radiation of the first wavelength range into radiation of a fifth wavelength range, which is different from the first, and second, wavelength ranges, the casting material being disposed downstream of the first, second and third wavelength-converting layers.

* * * * *

UNITED STATES PATENT AND TRADEMARK OFFICE
CERTIFICATE OF CORRECTION

PATENT NO.         : 7,982,233 B2                              Page 1 of 1
APPLICATION NO.    : 12/301538
DATED              : July 19, 2011
INVENTOR(S)        : Dirk Berben and Frank Jermann It is certified that error appears in the above-identified patent and that said Letters Patent is hereby corrected as shown below:

Title page, item (73) (Assignee), column 1, line 2, delete "Regensberg" and insert -- Regensburg --.

Column 1, line 16, delete "102006024165.7" and insert -- 102006024165.7, --.

In Claim 2, column 14, line 59, delete "region-different" and insert -- region different --.

In Claim 2, column 14, line 60, delete "region-of" and insert -- region of --.

Signed and Sealed this
Twenty-second Day of November, 2011

David J. Kappos
*Director of the United States Patent and Trademark Office*